(12) United States Patent
Jiang et al.

(10) Patent No.: US 10,128,281 B2
(45) Date of Patent: Nov. 13, 2018

(54) ARRAY SUBSTRATE, FABRICATION METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaohui Jiang, Beijing (CN); Jian Guo, Beijing (CN); Tiansheng Li, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/439,999

(22) PCT Filed: Sep. 5, 2014

(86) PCT No.: PCT/CN2014/086081
§ 371 (c)(1),
(2) Date: Apr. 30, 2015

(87) PCT Pub. No.: WO2015/055054
PCT Pub. Date: Apr. 23, 2015

(65) Prior Publication Data
US 2015/0303225 A1    Oct. 22, 2015

(30) Foreign Application Priority Data

Oct. 16, 2013    (CN) .......................... 2013 1 0485935

(51) Int. Cl.
*H01L 27/12* (2006.01)
*G02F 1/1362* (2006.01)
(Continued)

(52) U.S. Cl.
CPC .... *H01L 27/1262* (2013.01); *G02F 1/136286* (2013.01); *H01L 27/124* (2013.01);
(Continued)

(58) Field of Classification Search
CPC .... G02F 1/1368; G02F 1/13394; G02F 7/427; H01L 27/1214; H01L 29/55765
See application file for complete search history.

(56) References Cited

U.S. PATENT DOCUMENTS 6,261,880 B1 * 7/2001 Wu ....................... G02F 1/1368
257/E21.414
7,714,975 B1 * 5/2010 Yamazaki ........... G02F 1/13394
349/123
(Continued)

FOREIGN PATENT DOCUMENTS

| CN | 101527283 A | 9/2009 |
| CN | 101581861 A | 11/2009 |

(Continued)

OTHER PUBLICATIONS

English translation of ISA written opinion for PCT/CN2014/086081.*
(Continued)

*Primary Examiner* — Yu Chen
*Assistant Examiner* — Vincent Wall
(74) *Attorney, Agent, or Firm* — Banner & Witcoff, Ltd.

(57) ABSTRACT

A fabrication method includes preparing a base substrate, the base substrate including a pixel region and a region of gate on array (GOA); forming a pattern including a gate electrode and a pattern of an active layer on the base substrate, and forming a gate lead on the region of GOA, by a first patterning process; forming a pattern of a gate insulating layer by a second patterning process; forming a pattern including a source/drain electrode by a third pattern- (Continued)

ing process; forming a pattern of a planarization layer by a fourth patterning layer; and forming a pattern including a pixel electrode by a fifth patterning layer. Here, the pattern including the gate electrode and the pattern including the active layer are formed by one patterning process, which can reduce the number of masks in the fabrication process of the array substrate, improve production efficiency and save the cost.

9 Claims, 5 Drawing Sheets

(51) Int. Cl.
*H01L 29/66* (2006.01)
*G02F 1/1368* (2006.01)

(52) U.S. Cl.
CPC .... *H01L 27/1288* (2013.01); *H01L 29/66765* (2013.01); *G02F 1/1368* (2013.01); *G02F 2001/136295* (2013.01)

(56) References Cited

U.S. PATENT DOCUMENTS

| | | | | |
|---|---|---|---|---|
| 8,815,663 | B2* | 8/2014 | Park | H01L 29/66757 257/66 |
| 2001/0038089 | A1* | 11/2001 | Levenson | G03F 7/427 252/79.1 |
| 2002/0127887 | A1* | 9/2002 | Uehara | H01L 29/66765 438/800 |
| 2004/0087064 | A1 | 5/2004 | Lee | |
| 2006/0102911 | A1* | 5/2006 | Ryu | H01L 51/5088 257/88 |
| 2006/0186409 | A1* | 8/2006 | Horino | G02F 1/136227 257/59 |
| 2007/0249104 | A1* | 10/2007 | Lin | H01L 27/1214 438/151 |
| 2008/0003726 | A1* | 1/2008 | Park | H01L 27/1288 438/149 |
| 2009/0284677 | A1 | 11/2009 | Shin et al. | |
| 2013/0329157 | A1* | 12/2013 | Chang | H01L 29/66969 349/43 |
| 2016/0064426 | A1 | 3/2016 | Xu et al. | |

FOREIGN PATENT DOCUMENTS

| | | |
|---|---|---|
| CN | 101587861 A | 11/2009 |
| CN | 102629590 A | 8/2012 |
| CN | 102651403 A | 8/2012 |
| CN | 102655156 A | 9/2012 |
| CN | 103018991 A | 4/2013 |
| TW | 560076 B | 11/2003 |
| TW | I298545 B | 7/2008 |

OTHER PUBLICATIONS

Dec. 4, 2014—(WO) International Search Report—App PCT/CN2012/086081—Eng Tran.
Dec. 16, 2016—(CN) First Office Action Appn 201310485935.9 with English Tran.
Aug. 16, 2017—(CN) Second Office Action Appn 201310485935.9 with English Tran.
Apr. 18, 2018—(CN) Office Action application 201310485935.9 with English Translation.

* cited by examiner

US 10,128,281 B2

ARRAY SUBSTRATE, FABRICATION METHOD THEREOF AND DISPLAY DEVICE

The application is a U.S. National Phase Entry of International Application No. PCT/CN2014/086081 filed on Sep. 5, 2014, designating the United States of America and claiming priority to Chinese Patent Application No. 201310485935.9 filed on Oct. 16, 2013. The present application claims priority to and the benefit of the above-identified applications and the above-identified applications are incorporated by reference herein in their entirety.

TECHNICAL FIELD

Embodiments of the present invention relate to an array substrate, a fabrication method thereof and a display device.

BACKGROUND

A thin film transistor liquid crystal display (TFT-LCD) has been paid more and more attention over the years. At present, a high-resolution low-power TFT-LCD has become a focus of research and development.

The high-resolution low-power TFT-LCD needs to form a non-photosensitive resin structure of low dielectric constant. FIG. 1 shows a cross-sectional diagram of an array substrate provided with the non-photosensitive resin structure. As shown in FIG. 1, the array substrate is divided into a pixel region and a region of gate on array (region of GOA), respectively positioned on a left side and a right side of a dotted line in the diagram, and these two regions are formed simultaneously by a plurality of patterning processes. The array substrate comprises: a gate electrode 102 and a gate line (not shown) formed in a display region of a substrate 101, and a gate lead 102' in the region of GOA; a gate insulating layer 103 covering the entire substrate 101 and formed above the gate electrode 102 and the gate line (not shown); an active layer 104 formed above the gate insulating layer 103; an ohmic contact layer 105 formed above the active layer 104; a source/drain electrode 107 formed on the ohmic contact layer 105 and the gate insulating layer 103, and a metal layer 107' disposed in the same plane as the source/drain electrode 107 and formed simultaneously with the source/drain electrode 107 in the region of GOA, the metal layer being connected to the gate lead through a via hole 115 in the gate insulating layer 103; a planarization layer 109 formed above the source/drain electrode 107 and the metal layer 107' and on the gate insulating layer 103; a pixel electrode 110 formed on the planarization layer 109 and connected to the source/drain electrode 7 through a via hole 116 in the planarization layer 109; a first passivation layer 111 formed on the planarization layer 109 and the pixel electrode 110; a common electrode 112 formed on the first passivation layer 111, and an electrode 117 disposed in the same layer as the common electrode 112, connected to the metal layer 107' disposed in the same layer as the source/drain electrode 107 through the via hole 115 passing through the first passivation layer 111 and the planarization layer 109 in the region of GOA.

Currently, since a planarization layer is manufactured, a large number of masks are required, and generally, manufacturing the structure as shown in FIG. 1 requires eight patterning processes, which are: a first patterning process for forming the gate electrode 102, the gate line (not shown) and the gate lead 102'; a second patterning process for forming the gate insulating layer 103; a third patterning process for forming the active layer 104 and the ohmic contact layer 105; a fourth patterning process forming the source/drain electrode 107 and the metal layer 107' disposed in the same layer as the source/drain electrode 107; a fifth patterning process for forming the planarization layer 109; a sixth patterning process for forming the pixel electrode 110; a seventh patterning process for forming the first passivation layer 111; and an eighth patterning process for forming the common electrode 112 and an electrode 112' disposed in the same layer as the common electrode 112. Therefore, a large number of masks are needed, such that the manufacturing process is complex, and productivity is relatively low.

SUMMARY OF THE INVENTION

Embodiments of the present invention provide an array substrate and a fabrication method thereof, and a display device, which can reduce the number of masks in the fabrication process, and can improve the production efficiency.

In one aspect, an embodiment of the present invention provides a fabrication method of an array substrate, comprising: preparing a base substrate, the base substrate comprising a pixel region and a region of GOA; forming a pattern including a gate electrode and a pattern of an active layer and forming a gate lead in the region of GOA on the base substrate, by a first patterning process; forming a pattern of a gate insulating layer by a second patterning process; forming a pattern including a source/drain electrode by a third patterning process; forming a pattern of a planarization layer by a fourth patterning layer; forming a pattern including a pixel electrode by a fifth patterning layer.

In another aspect, an embodiment of the present invention further provides an array substrate, comprising: a base substrate, including a pixel region and a region of GOA; a pattern including a gate electrode, a pattern of a gate insulating layer, a pattern of an active layer, a pattern including a source/drain electrode, a pattern of a planarization layer, and a pattern including a pixel electrode, which are formed on the base substrate sequentially.

In still another aspect, an embodiment of the present invention further provides a display device, comprising any array substrate described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 9-1 is a cross-sectional structure diagram after depositing a source/drain metal film in the fabrication method of the array substrate in the embodiment of the present invention;

FIG. 9-2 is a cross-sectional structure diagram after coating photosensitive material on the source/drain metal film in the fabrication method of the array substrate in the embodiment of the present invention;

FIG. 9-3 is a cross-sectional structure diagram after exposing and developing the photosensitive material by using a mask in the fabrication method of the array substrate in the embodiment of the present invention;

DESCRIPTION OF THE EMBODIMENTS

Figure 1:
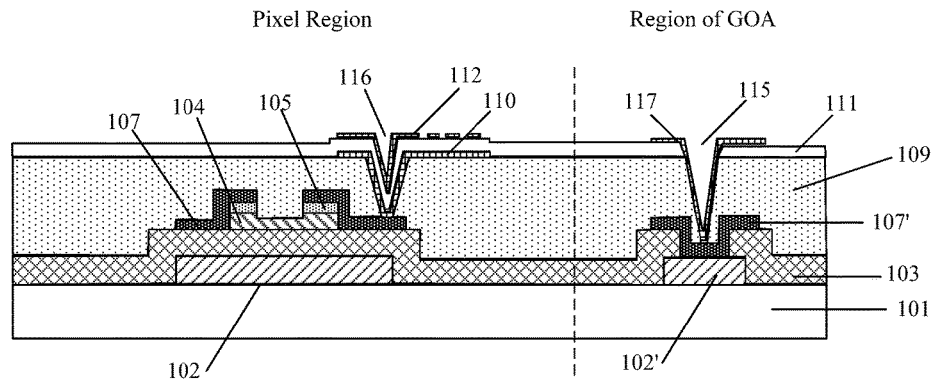
FIG. 1 is a cross-sectional structural schematic diagram of an existing array substrate including a resin.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In an embodiment of the present invention, a gate electrode and an active layer are formed simultaneously by one patterning process using a half tone mask and a lift off technology, which can reduce the number of masks, improve the production efficiency, and reduce the cost.

Exemplarily, it should be understood that, in the embodiment of the present invention, a patterning process refers to a process of forming a pattern including coating, exposing, developing and etching a photoresist or a photosensitive material, and stripping the photoresist or the photosensitive material. Of course, the process of forming a pattern in the embodiment of the present invention may also adopt other processes for forming the pattern such as printing, etc.

The photoresist or the photosensitive material is a kind of material sensitive to light; by taking the photoresist as an example, it can be divided into two types of negative photoresist and positive photoresist depending on a chemical reaction mechanism and a developing principle. A negative photoresist can be changed to be an insoluble substance to a developing solution after light irradiation; on the contrary, a positive photoresist can be changed to be a soluble substance to a developing solution after light irradiation. The embodiment of the present invention is illustrated by taking the positive photoresist as an example, that is, the photoresist per se is insoluble for a developing solution, and becomes a soluble substance after exposure so as to expose a structure on the substrate. Correspondingly, in the embodiment of the present invention, a photoresist completely removed region is formed on the substrate by a transparent region of a mask, a photoresist completely-retained region is formed on the substrate by an opaque region of the mask, and a photoresist half-retained region is formed on the substrate by a semi-transparent region of the mask.

Hereinafter, the embodiment of the present invention is illustrated in detail in conjunction with the drawings. Therein, in respective drawings, a left region of a dotted line is a pixel region of an array substrate, and a right region of the dotted line is a region of GOA, that is, a peripheral lead region for forming a circuit.

Exemplarily, a fabrication method of an array substrate according to an embodiment of the present invention, comprises:

Step 201: preparing a base substrate, the base substrate including a pixel region and a region of GOA;

Step 202: forming a pattern including a gate electrode, a gate insulating layer and a pattern of an active layer on the base substrate, and forming a gate lead in the region of GOA, by a first patterning process;

In this step, the pattern including the gate electrode, the gate insulating layer and the active layer are formed on the base substrate by the first pattering process using a half tone mask and a lift off process; in the half tone mask, a region corresponding to the pattern of the active layer is opaque, a region corresponding to the gate electrode in a pixel region and a region corresponding to a gate lead in the region of GOA are both semi-transparent, and other regions are transparent.

Exemplarily, step 202 includes:

Firstly, forming a gate metal layer film, a gate insulating layer film and an active layer film on the base substrate sequentially;

Then, coating photosensitive material on the active layer film;

Thirdly, exposing and developing the photosensitive material by using a half tone mask, to form a photosensitive material completely-retained region in a region corresponding to the pattern of the active layer, form a photosensitive material half-retained region in a region corresponding to the pattern including the gate electrode, and remove the photosensitive material in other regions.

Exemplarily, by taking the positive photoresist as an example, the positive photoresist is exposed and developed by using the half tone mask, and a region of the half tone mask corresponding to the pattern of the active layer is opaque, where the positive photoresist is completely-retained; a region of the half tone mask corresponding to the pattern including the gate electrode is semi-transparent, where the positive photoresist is partially retained; and other regions of the half tone mask corresponding to the base substrate are fully transparent, where the positive photoresist is completely removed.

Further, removing the active layer film, the first gate insulating layer film and the gate metal layer film in the photosensitive material completely removed region by a first etching;

Further, performing an ashing process to remove the photosensitive material in the photosensitive material half-retained region, and removing the active layer film and the gate insulating layer film in the photosensitive material half-retained region by a second etching, to obtain the pattern including the gate electrode, the gate insulating layer and the active layer;

Further, forming an insulating layer film covering the entire base substrate by using a material for forming the gate insulating layer film;

Finally, removing the insulating layer film and the photosensitive material in the photosensitive material completely-retained region by using the lift off process, to obtain the pattern of the active layer.

Step 203: forming a pattern of an insulating layer on the base substrate on which the pattern including the gate electrode, the gate insulating layer and the active layer are formed, by a second patterning process;

Step 204: forming a pattern including a source/drain electrode on the base substrate on which the pattern of the gate insulating layer is formed, by a third patterning process;

Step 205: forming a pattern of a planarization layer on the base substrate on which the pattern of the source/drain electrode is formed, by a fourth patterning layer;

Step 206: forming a pattern including a pixel electrode, a pattern of a first passivation layer and a pattern of a common electrode sequentially on the base substrate on which the pattern of the planarization layer is formed, by a patterning process.

Exemplarily, a thickness of the gate insulating layer film is same as that of the insulating layer film, so that there is no step formed between the gate insulating layer and the insulating layer.

Exemplarily, the fabrication method of the array substrate according to the embodiment of the present invention further comprises: forming a pattern of an ohmic contact layer, after the forming a pattern of the active layer.

Exemplarily, the forming a pattern of an ohmic contact layer includes:

Forming a prepattern of the pattern of the ohmic contact layer that is identical with, i.e., conformal with the pattern of the active layer by the first patterning process, while forming the pattern of the active layer; and Etching the prepattern of the pattern of the ohmic contact layer to form the pattern of the ohmic contact layer, while forming the pattern including the source/drain electrode.

Next, the steps of the fabrication method of the array substrate according to the embodiment of the present invention are described in detail in conjunction with FIGS. 2-11.

Here, it should be noted that FIGS. 2-11 illustrate an example of forming the pattern of the ohmic contact layer after forming the pattern of the active layer, that is to say, an ohmic contact layer film is further formed on an active layer film. However, if it is unnecessary to form the pattern of the ohmic contact layer, there is no need to form the ohmic contact layer film on the active layer film; no corresponding drawing is given here, and the embodiment of the present invention makes no limitation thereto.

Figure 2:
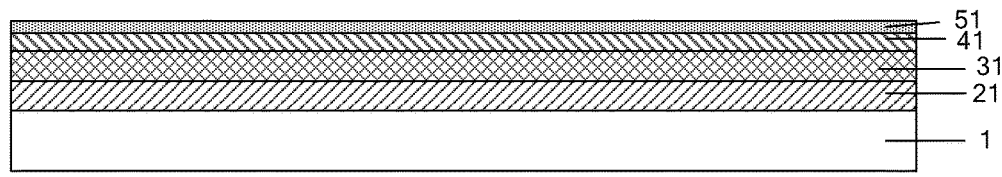
FIG. 2 is a cross-sectional structural diagram after depositing a gate metal film, a gate insulating layer film, an active layer film and an ohmic contact layer film on a base substrate in a fabrication method of an array substrate according to an embodiment of the present invention.
Figure 3:
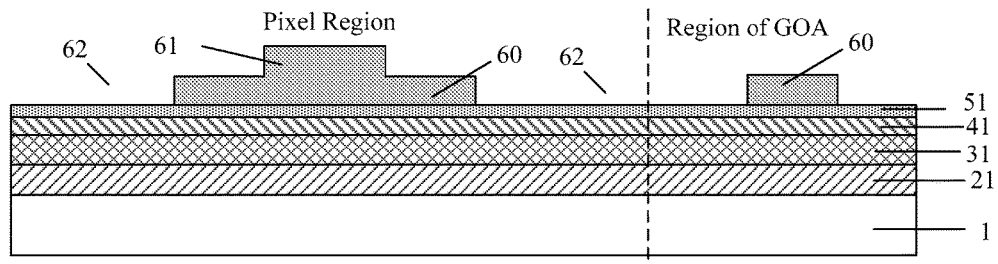
FIG. 3 is a cross-sectional structural diagram after exposing and developing photosensitive material by using a half tone mask in the fabrication method of the array substrate according to the embodiment of the present invention.
Figure 4:
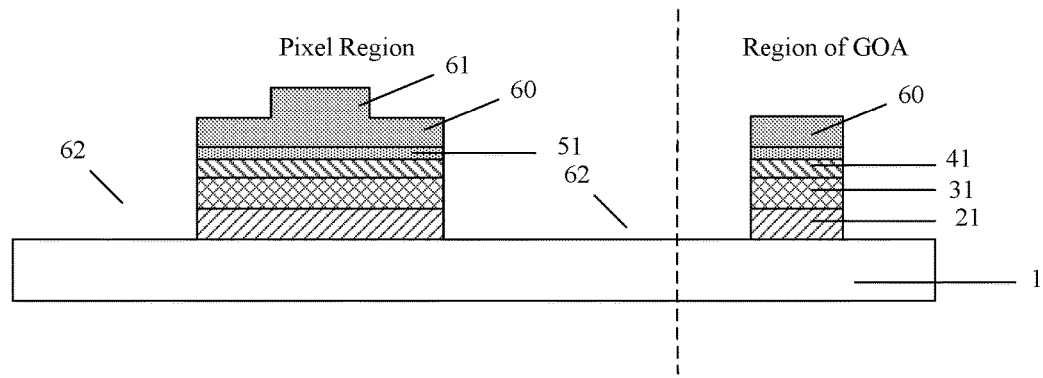
FIG. 4 is a cross-sectional structural diagram after forming a pattern including a gate electrode in the fabrication method of the array substrate according to the embodiment of the present invention.
Figure 5:
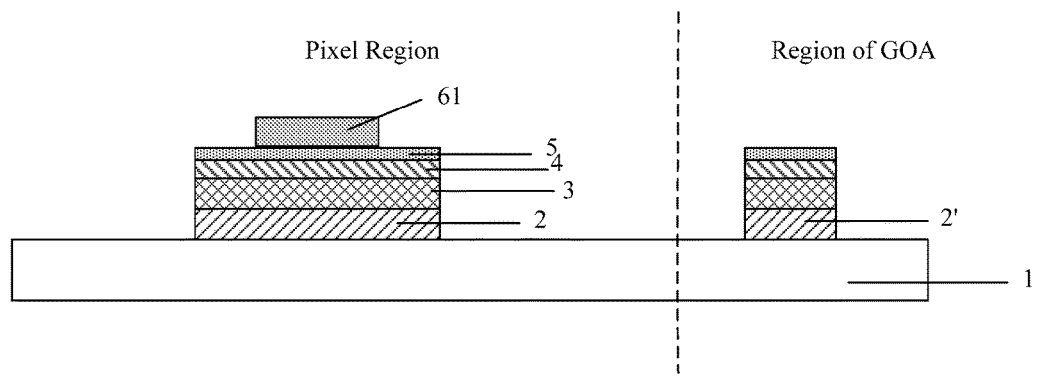
FIG. 5 is a cross-sectional structural diagram after performing an ashing process on the photosensitive material in the fabrication method of the array substrate according to the embodiment of the present invention.
Figure 6:
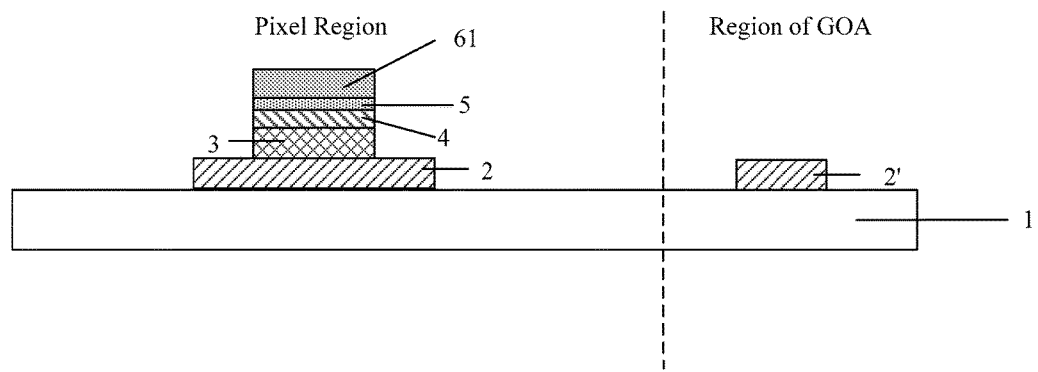
FIG. 6 is a cross-sectional diagram of an array substrate obtained by etching after the ashing process in the fabrication method of the array substrate according to the embodiment of the present invention.

Exemplarily, step 202 includes;

Depositing a gate metal layer film 21 on a base substrate 1, wherein the gate metal layer film 21 may be made from a metal material such as aluminum, copper, chromium or molybdenum, or an alloy thereof. Then, sequentially depositing a gate insulating layer film 31, which exemplarily may be made from $SiN_x$, and an active layer film 41, as shown in FIG. 2, on the gate metal layer film 21, and forming an ohmic contact layer film 51 on the active layer film 41;

Thereafter, coating a photosensitive material 6 such as a photoresist or a photosensitive resin on the ohmic contact layer film 51, exposing and developing the photoresist material by using a half tone mask, to form a photosensitive material completely-retained region 61 in a region corresponding to the pattern of the active layer and the pattern of the ohmic contact layer, form a photosensitive material half-retained region 60 in a region corresponding to the pattern including the gate electrode, a gate insulating layer and an active layer, and form a photosensitive material completely removed region 62 in other regions;

Here, by taking the positive photoresist as an example, the photosensitive material is exposed and developed by using the half tone mask, and a region of the half tone mask corresponding to the pattern of the active layer and the pattern of the ohmic contact layer is opaque, where the positive photoresist is completely-retained; a region of the half tone mask corresponding to the pattern including the gate electrode is semi-transparent, where the positive photoresist is partially retained; and other regions of the half tone mask corresponding to the base substrate are transparent, where the positive photoresist is completely removed;

Thereafter, by using the half tone mask, in which a region corresponding to a pattern of an active layer 4 to be formed is opaque, a region corresponding to the to-be-formed gate electrode 2 of the pixel region and a region corresponding to the gate lead in the region of GOA are both semi-transparent, and the other regions are transparent, and exposing and developing the photoresist or the photoresist resin by using the half tone mask, to obtain the structure shown in FIG. 3;

Then, performing an etching, and removing the gate metal layer film 21, the gate insulating layer film 31, the active layer film 41, and the ohmic contact layer film 51 in the photosensitive material (the photoresist or the photosensitive resin) completely removed region 62 by an etching, to form the structure shown in FIG. 4, i.e., a region corresponding to the transparent region of the half tone mask is completely etched off;

Next, performing an ashing process on the photosensitive material (the photoresist or the photosensitive resin), to remove the photosensitive material in the photosensitive material half-retained region, so as to obtain the structure shown in FIG. 5; then performing a second etching, to remove the ohmic contact layer film 51, the active layer film 41 and the gate insulting layer film 31 in the photosensitive material half-retained region 61, so as to obtain the pattern including the gate electrode 2, the insulating layer 3 and the active layer 4, as shown in FIG. 6;

Thereafter, further forming an insulating layer film 32 covering the entire substrate by using a material same as the material for the gate insulating layer film, and removing the insulating layer film and the photosensitive material in the photosensitive material completely-retained region 61 by using the lift off process, to obtain the pattern of the active layer.

Figure 7:
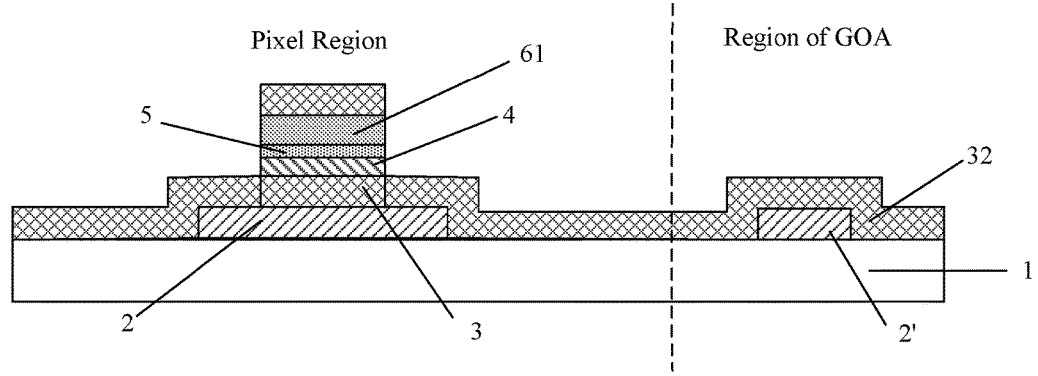
FIG. 7 is a cross-sectional structural diagram after depositing an insulating layer film in the fabrication method of the array substrate according to the embodiment of the present invention.
Figure 8:
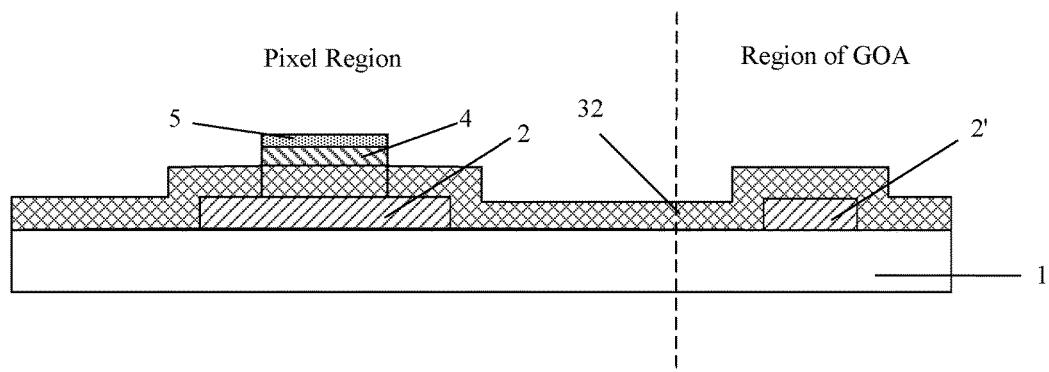
FIG. 8 is a cross-sectional structural diagram after forming a pattern of an active layer in the fabrication method of the array substrate according to the embodiment of the present invention.

Exemplarily, herein, the photoresist or the photosensitive resin 61 is not stripped, i.e., the photoresist or the photosensitive resin 61 on the active layer film 4 is reserved, and the insulating layer film 32 covering the entire substrate is further deposited by plasma enhanced chemical vapor deposition (PECVD), to obtain the structure shown in FIG. 7, wherein, the insulating layer film 32 is has a same thickness as the gate insulating layer film 31 shown in FIG. 2, then the second gate insulating layer film and the photosensitive material (the photoresist or the photosensitive resin) are removed in the photosensitive material completely-retained region by using the lift off process, to obtain the pattern of the active layer 4, as shown in FIG. 8.

At that time, a prepattern of the pattern of the ohmic contact layer is formed, and is identical with, i.e., conformal with the pattern of the active layer. For the prepattern of the pattern of the ohmic contact layer, when the pattern of the source/drain electrode is formed subsequently, a pattern of an ohmic contact layer 5 is formed by etching off the ohmic contact layer film 51 in a channel region. Exemplarily, when etching a source/drain metal film subsequently, a metal layer in a source/drain region and the region of GOA is firstly etched by wet etching, and then the ohmic contact layer film 51 in the channel region is etched by dry etching, to form the pattern of the source/drain electrode and the pattern of the ohmic contact layer 5.

Obviously, in this step, the gate electrode 2 and the active layer 4 are formed at the same time by one mask, and only by one patterning process using the half tone mask, which as compared with the prior art, spares one mask, saves costs, and improves production efficiency.

Exemplarily, step 203 includes:

On the base substrate on which the pattern including the gate electrode 2 and the pattern of the active layer 4 are formed, patterning the insulating layer film 32 deposited, i.e., exposing and developing, and etching by using a mask, to form the pattern of the gate insulating layer, which includes a via hole 13. Therein, the via hole 13 is formed at a position of the insulating layer 32 corresponding to the gate lead 2' in the region of GOA, as shown in FIG. 9.

Figure 9:
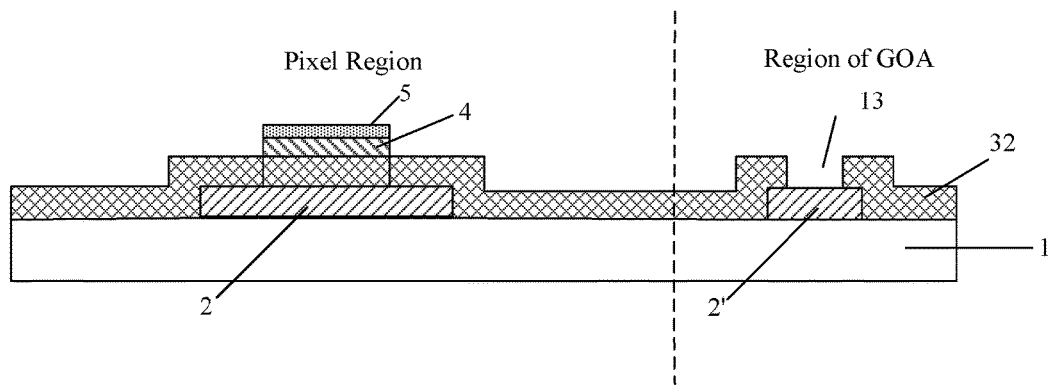
FIG. 9 is a cross-sectional structural diagram after forming a pattern of a gate insulating layer in the fabrication method of the array substrate in the embodiment of the present invention.
Figure 10:
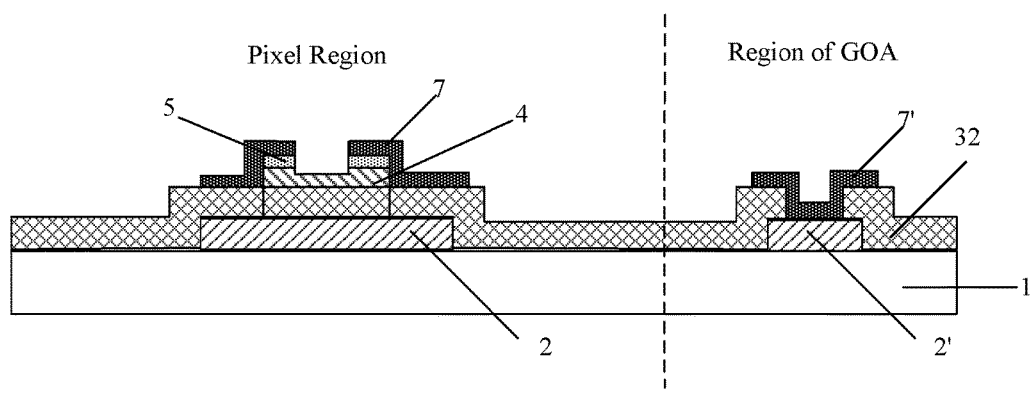
FIG. 10 is a cross-sectional structural diagram after forming a pattern including a source/drain electrode and a channel in the fabrication method of the array substrate according to the embodiment of the present invention.
Figures 1, 9:
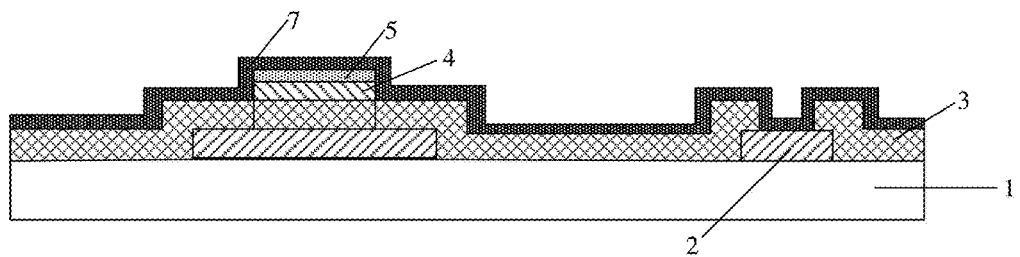
Figures 2, 9:
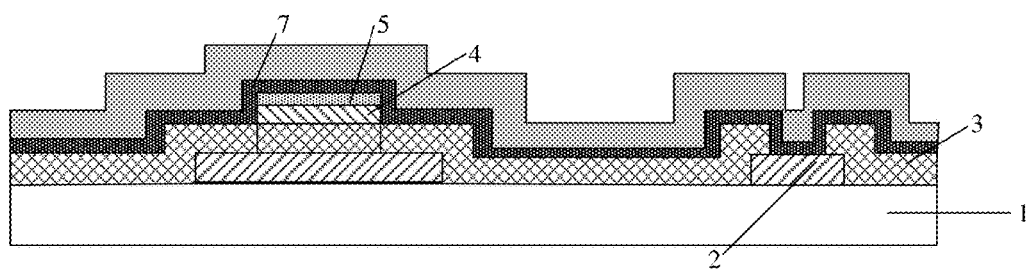
Figures 3, 9:
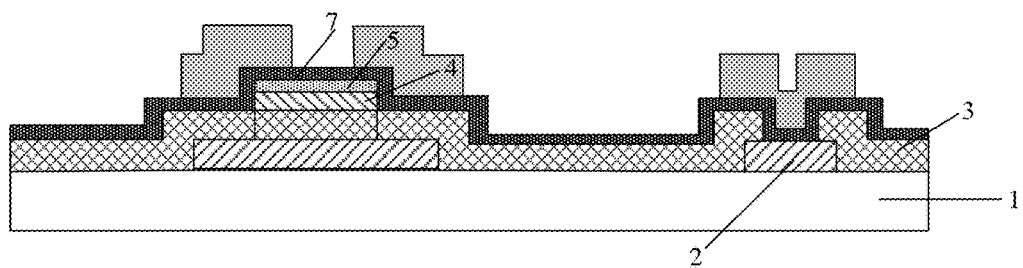

Exemplarily, step 204 includes:

Further depositing a source/drain metal film on the base substrate on which the pattern of the gate insulating layer 3 is formed, as illustrated in FIG. 9-1;

Coating photosensitive material on the source/drain metal film, as illustrated in FIG. 9-2;

Exposing and developing the photosensitive material by using a mask, to form the photosensitive material completely removed region corresponding to a gate lead in a GOA region and corresponding to a channel region, as illustrated in FIG. 9-3;

Etching the source/drain metal film and the ohmic contact layer film 51 in the photosensitive material completely removed region 62;

Removing the remaining photosensitive material, to form the pattern of the source/drain electrode 7 and the pattern of the ohmic contact layer 5, to form the source/drain electrode 7 and a channel, wherein the pattern including the source/drain electrode 7 formed in the region of GOA is connected to the gate lead 2' through a via hole 13 in the pattern of the gate insulating layer 3, as shown in FIG. 10.

Exemplarily, after the step 204, the method further comprises: forming a pattern of a first passivation layer 8 on the substrate on which the pattern of the source/drain electrode 7 is formed, includes:

Further depositing a layer of non-metal material on the base substrate, such as silicon nitride with a thickness of 300~800 Å, to form the pattern of the first passivation layer 8, which covers the entire base substrate, i.e., being formed above the pattern of the gate insulating layer 3 and the pattern including the source/drain electrode 7.

Here, the pattern of the first passivation layer 8 is formed in order to prevent an organic resin solvent component contained in an overflow gas upon heating the planarization layer subsequently from penetrating the active layer, thereby increasing defects on a surface of the active layer, and affecting characteristics and stability of the TFT.

Figure 11:
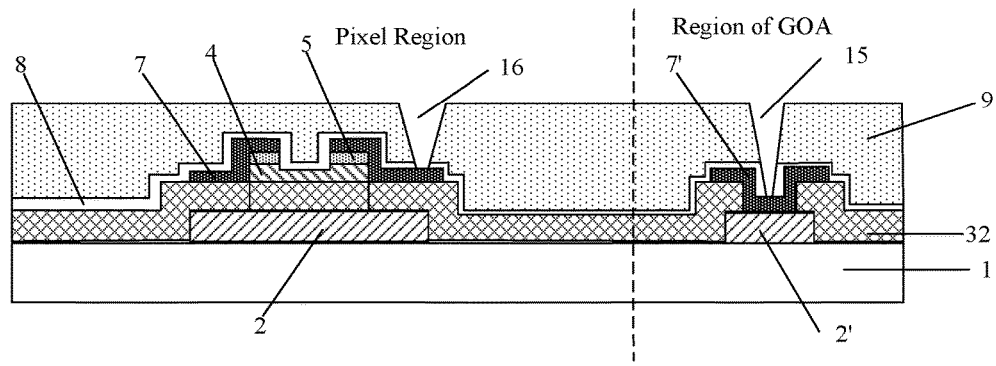
FIG. 11 is a cross-sectional structural diagram after forming a pattern of a passivation layer in the fabrication method of the array substrate according to the embodiment of the present invention.

Exemplarily, step 205: forming a pattern of a planarization layer 9 on the base substrate on which the pattern of the source/drain electrode 7 is formed, includes:

Coating a resin material, e.g., an organic resin, on the base substrate on which the pattern including the source/drain electrode 7 is formed, forming a pattern of a planarization layer 9 by a patterning process, and the planarization layer 9 is provided with a via hole 16 in a region corresponding to the pixel region and a via hole 15 in a region corresponding to the region of GOA, as shown in FIG. 11. Here, the planarization layer 9 has a thickness of 1.8~2.5 μm.

Figure 12:
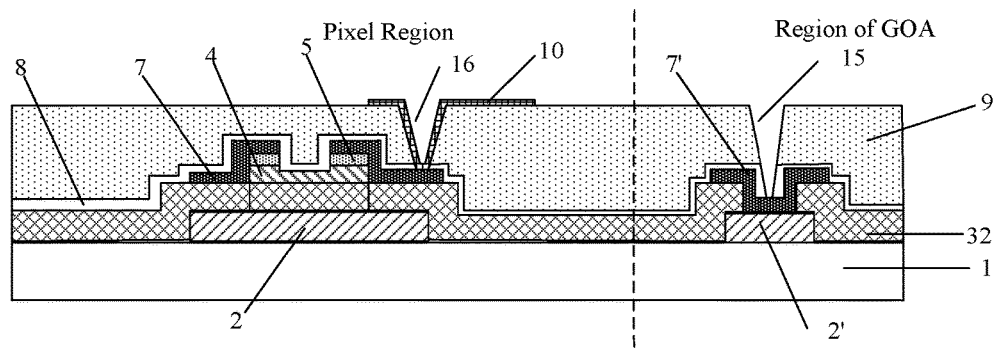
FIG. 12 is a cross-sectional structural diagram after forming a pattern including a pixel electrode in the fabrication method of the array substrate according to the embodiment of the present invention.
Figure 13:
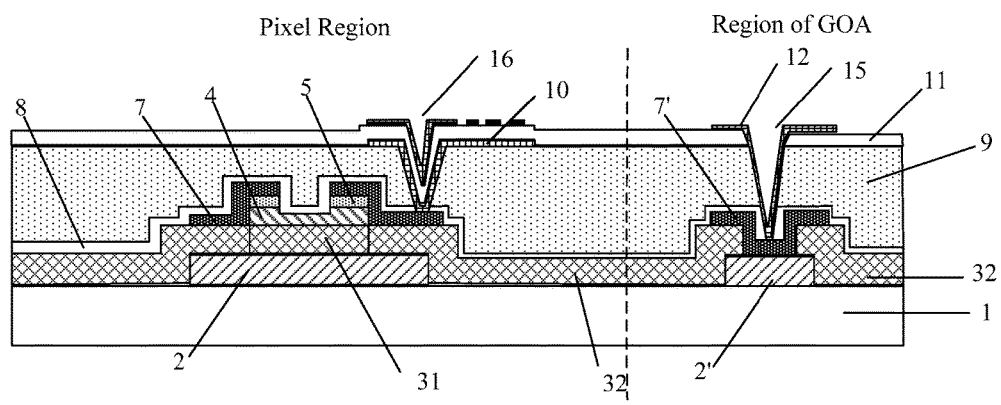
FIG. 13 is a cross-sectional structural schematic diagram of an array substrate containing a resin according to an embodiment of the present invention.

Exemplarily, step 206: forming a pattern including a pixel electrode, a pattern of a second passivation layer and a pattern of a common electrode sequentially on the base substrate on which the pattern of the planarization layer is formed, includes:

Depositing a layer of transparent conductive material film, which may be made of a material such as ITO, on the base substrate on which the pattern of the planarization layer 9 is formed, and patterning the same to form a pattern of a pixel electrode 10, as shown in FIG. 12;

Depositing a layer of non-metal film, which may be made of material such as $SiN_x$, on the base substrate on which the pattern of the pixel electrode 10 is formed, and patterning the same to form a pattern of a second passivation layer 11, which is provided with a via hole 15, as shown in FIG. 12;

Further depositing a layer of transparent conductive material film, with a thickness of 500~800 Å, and patterning the same to form a pattern of a common electrode 12, as shown in FIG. 13.

It can be seen from the above fabrication method of the array substrate that as compared with the prior art in which the fabrication of the gate electrode and the active layer each requires one mask, the fabrication of the gate electrode and the active layer in the embodiment of the present invention only requires one mask, which reduces the number of patterning processes, effectively saves the cost, and improves the production efficiency.

An embodiment of the present invention further provides an array substrate. The array substrate is fabricated by using the above method, and its structure is shown in FIG. 13. The array substrate comprises: a gate electrode 2 formed on a base substrate 1; a gate insulating layer 3 covering the entire base substrate 1 and formed on the gate electrode 2; an active layer 4 formed on the gate insulating layer 3; a source/drain electrode 7 formed on the pattern of the gate insulating layer 3; a planarization layer 9 formed on the source/drain electrode 7 and the gate insulating layer 3; a pixel electrode 10 formed on the planarization layer 9 and connected to the source/drain electrode 7 through the via hole 16 in the passivation layer 9; wherein the gate electrode 2 and the active layer 4 are formed by one patterning process.

Exemplarily, in a pixel region, the insulating layer between the active layer 4 and the gate electrode 2 includes the gate insulating layer 3 formed by a gate insulating layer film and an insulating layer 32 formed by a insulating layer film; in a region of GOA, the insulating layer 32 covers the gate lead 2', and the gate insulating layer 3 and the insulating layer 32 are same in thickness, and the gate insulating layer 3 is conformal with the active layer 4.

Exemplarily, the array substrate further comprises: an ohmic contact layer 5 formed above the active layer 4 and below the source/drain electrode 7.

Exemplarily, the array substrate further comprises: a first passivation layer 8 formed above the source/drain electrode 7 and below a planarization layer 9.

Exemplarily, the array substrate further comprises: a second passivation layer 11 formed above the pixel electrode 10, as shown in FIG. 13, and a common electrode 12 formed above the second passivation layer 11.

An embodiment of the present invention further provides a display device, the display device comprising the array substrate described above.

In the array substrate and the fabrication method thereof and the display device provided by the embodiments of the present invention, the gate electrode and the active layer are formed on the substrate by one patterning process using a half tone mask. As compared with the prior art in which the fabrication of the gate electrode and the active layer requires two masks, while in the embodiment of the present invention, the fabrication of the gate electrode and the active layer only needs one mask, which reduces the number of patterning processes, efficiently saves the cost, and improves production efficiency.

The foregoing implementation modes are only illustrative of the present invention, rather than limitative of the present invention. One of ordinary skill in the art can make various changes or modifications to the present invention without departing from the spirit and scope of the invention. Thus, all equivalent technical solutions also belong to the scope of the present invention, which is defined by the claims.

The present application claims priority of Chinese Patent Application No. 201310485935.9 filed on Oct. 16, 2013, the disclosure of which is incorporated herein by reference in its entirety as part of the present application.

What is claimed is:

1. A fabrication method of an array substrate, comprising:
   preparing a base substrate, the base substrate comprising a pixel region and a region of gate on array (GOA);
   forming a pattern including a gate electrode, a gate insulating layer and an active layer in the pixel region and a pattern of a gate lead in the region of GOA, by a first patterning process;
   forming a pattern of an insulating layer by a second patterning process;
   forming a pattern including a source/drain electrode by a third patterning process;
   forming a pattern of a first passivation layer and a pattern of a planarization layer by a fourth patterning process, wherein the first passivation layer is configured to protect the active layer; and
   forming a pattern including a pixel electrode by a fifth patterning layer;
   wherein forming a pattern including a gate electrode, a gate insulating layer and an active layer on the base substrate by a first patterning process, comprises:
   forming the pattern including the gate electrode, the gate insulating layer and the active layer by using a half tone mask and a lift off process; and
   wherein forming the pattern including the gate electrode, the gate insulating layer and the active layer by using a half tone mask and a lift off process, comprises:
   forming a gate metal layer film, a gate insulating layer film and an active layer film on the base substrate sequentially;
   coating a photosensitive material on the active layer film in the pixel region;
   exposing and developing the photosensitive material by using the half tone mask, so as to form a photosensitive material completely-retained region in a region of the pixel region corresponding to the pattern of the active layer, a photosensitive material half-retained region of the pixel region in a region corresponding to the pattern including the gate electrode which is laterally adjacent to the completely-retained region, and a photosensitive material completely removed region in the rest of the pixel region;
   removing exposed portions of the active layer film, of the gate insulating layer film and of the gate metal layer film by a first etching;
   performing an ashing process to remove the photosensitive material in the photosensitive material half-retained region, and removing the active layer film and the gate insulating layer film in the photosensitive material half-retained region by a second etching, to obtain the pattern including the gate electrode;
   forming an insulating layer film on the base substrate on which the pattern including the gate electrode is formed by using a material for forming the gate insulating layer film; and
   removing a portion of the insulating layer film above the photosensitive material, and the photosensitive material in the photosensitive material completely-retained region by using the lift off process, to obtain the pattern of the active layer.

2. The fabrication method according to claim 1, wherein a thickness of the gate insulating layer film is same as that of the insulating layer film.

3. The fabrication method according to claim 1, further comprising: forming a pattern of an ohmic contact layer after forming a pattern of an active layer.

4. The fabrication method according to claim 3, wherein forming a pattern of an ohmic contact layer, comprises:
   forming a prepattern of the pattern of the ohmic contact layer that is conformal with the pattern of the active layer by the first patterning process, while forming the pattern of the active layer; and
   etching the prepattern of the pattern of the ohmic contact layer to form the pattern of the ohmic contact layer.

5. The fabrication method according to claim 1, wherein the photosensitive material is a photoresist or a photosensitive resin.

6. The fabrication method according to claim 1, further comprising:
   forming a pattern of a second passivation layer by a sixth patterning process; and
   forming a pattern a common electrode by a seventh patterning process.

7. A fabrication method of an array substrate, comprising:
   preparing a base substrate, the base substrate comprising a pixel region and a region of gate on array (GOA);
   forming a pattern including a gate electrode, a gate insulating layer, an active layer and an ohmic contact layer in the pixel region and a pattern of a gate lead in the region of GOA, by a first patterning process;
   forming a pattern of an insulating layer by a second patterning process;
   forming a pattern including a source/drain electrode by a third patterning process;

forming a pattern of a first passivation layer and a pattern of a planarization layer by a fourth patterning process, wherein the first passivation layer is configured to protect the active layer; and forming a pattern including a pixel electrode by a fifth patterning layer;

wherein forming a pattern including a gate electrode, a gate insulating layer, an active layer and an ohmic contact layer on the base substrate by a first patterning process, comprises:

forming a gate metal layer film, a gate insulating layer film, an active layer film and an ohmic contact layer film on the base substrate sequentially;

coating a photosensitive material on the ohmic contact layer film in the pixel region;

exposing and developing the photosensitive material by using the half tone mask, so as to form a photosensitive material completely-retained region in a region of the pixel region corresponding to the pattern of the active layer and the pattern of the ohmic contact layer, a photosensitive material half-retained region in a region of the pixel region corresponding to the pattern including the gate electrode which is laterally adjacent to the completely-retained region, and a photosensitive material completely removed region in the rest of the pixel region;

removing exposed portions of the active layer film, of the gate insulating layer film and of the gate metal layer film by a first etching;

performing an ashing process to remove the photosensitive material in the photosensitive material half-retained region, and removing the ohmic contact layer film, the active layer film and the gate insulating layer film in the photosensitive material half-retained region by a second etching, to obtain the pattern including the gate electrode;

forming a second gate insulating layer film on the base substrate on which the pattern including the gate electrode is formed by using a material for forming the first gate insulating layer film; and removing a portion of the second gate insulating layer film above the photosensitive material and the photosensitive material in the photosensitive material completely-retained region by using the lift off process, to obtain the pattern of the active layer and a prepattern of a pattern of the ohmic contact layer.

8. The fabrication method according to claim 7, further comprising etching the prepattern of the pattern of the ohmic contact layer to form the pattern of the ohmic contact layer, which comprises:

forming a source/drain metal film on the base substrate on which the pattern of the active layer is formed;

coating photosensitive material on the source/drain metal film;

exposing and developing the photosensitive material by using a mask, to form the photosensitive material completely removed region corresponding to the gate lead in the region of GOA and corresponding to a channel region of a thin film transistor;

etching the source/drain metal film and the ohmic contact layer film in the photosensitive material completely removed region; and removing the remaining photosensitive material, to form the pattern of the source/drain electrode and the pattern of the ohmic contact layer.

9. The fabrication method according to claim 8, wherein etching the source/drain metal film and the ohmic contact layer film in the photosensitive material completely removed region, comprises:

removing the source/drain metal film in a channel region and the region of GOA by wet etching; and removing the ohmic contact layer film in the channel region by dry etching.

* * * * *